United States Patent
Harada et al.

(10) Patent No.: US 7,221,007 B2
(45) Date of Patent: May 22, 2007

(54) SHEET FOR OPTICAL-SEMICONDUCTOR ELEMENT ENCAPSULATION AND PROCESS FOR PRODUCING OPTICAL SEMICONDUCTOR DEVICE USING THE SHEET

(75) Inventors: Noriaki Harada, Osaka (JP); Yuji Hotta, Osaka (JP); Ichirou Suehiro, Osaka (JP); Naoki Sadayori, Osaka (JP)

(73) Assignee: Nitto Denko Corporation, Osaka (JP)

( * ) Notice: Subject to any disclaimer, the term of this patent is extended or adjusted under 35 U.S.C. 154(b) by 114 days.

(21) Appl. No.: 11/098,420

(22) Filed: Apr. 5, 2005

(65) Prior Publication Data

US 2005/0220414 A1    Oct. 6, 2005

(30) Foreign Application Priority Data

Apr. 5, 2004    (JP) ............ P.2004-111050

(51) Int. Cl.
*H01L 31/072* (2006.01)
*H01L 31/109* (2006.01)
*H01L 31/0328* (2006.01)
*H01L 31/0336* (2006.01)

(52) U.S. Cl. ............ 257/200; 257/201; 257/289; 257/E33; 257/73

(58) Field of Classification Search ............ 438/26, 438/29, 30, 42, 51, 55, 64, 82, 108, 112; 257/79, 88, 522, 643, 777, 200, 70, 75, 77, 257/289, 201
See application file for complete search history.

(56) References Cited

U.S. PATENT DOCUMENTS 6,707,247 B2 * 3/2004 Murano ............ 313/501
7,082,244 B2 * 7/2006 Kawamonzen et al. ..... 385/129
2002/0185966 A1   12/2002 Murano

FOREIGN PATENT DOCUMENTS

| EP | 0 684 648 A2 |   | 11/1995 |
|----|--------------|---|---------|
| JP | 61-96780 A   |   | 5/1986  |
| JP | 61096780     | * | 5/1986  |
| JP | 9-50253 A    |   | 2/1997  |
| JP | 10-65220 A   |   | 3/1998  |
| JP | 2001-203392 A |  | 7/2001  |
| JP | 2003-249510 A |  | 9/2003  |

OTHER PUBLICATIONS

European Search Report dated Aug. 12, 2005.

* cited by examiner

*Primary Examiner*—David Nhu
(74) *Attorney, Agent, or Firm*—Sughrue Mion, PLLC

(57) ABSTRACT

The invention provides a sheet for optical-semiconductor element encapsulation, which has a multilayer structure including at least two resin layers. The at least two resin layers include: (A) an outermost resin layer (layer A) that is to be brought into contact with one or more optical semiconductor elements; and (B) a resin layer (layer B) disposed on the layer A and having a lower refractive index than that of the layer A. Also disclosed is a process for producing an optical semiconductor device using the sheet.

5 Claims, 1 Drawing Sheet

SHEET FOR OPTICAL-SEMICONDUCTOR ELEMENT ENCAPSULATION AND PROCESS FOR PRODUCING OPTICAL SEMICONDUCTOR DEVICE USING THE SHEET

FIELD OF THE INVENTION

The present invention relates to a sheet for optical-semiconductor element encapsulation and a process for producing an optical semiconductor device.

BACKGROUND OF THE INVENTION

An optical semiconductor device is known which includes optical semiconductor elements encapsulated with two or more resin layers. In this device, a first encapsulating resin, which is in direct contact with the optical semiconductor elements, is formed by dipping or potting, and the resin layers are disposed such that their refractive indexes become sequentially smaller, layer by layer, from the optical-semiconductor element side toward the outermost layer so as to have an improved efficiency of light takeout (see patent document 1).

Patent Document 1: JP 10-65220 A

However, resin encapsulation by dipping or potting has a drawback that the operation of dropping a liquid resin onto individual optical semiconductor elements in a given amount each is troublesome. Furthermore, the encapsulation of optical semiconductor elements with resin layers differing in refractive index necessitates two or more steps and is hence troublesome.

SUMMARY OF THE INVENTION

Accordingly, an object of the invention is to provide a sheet for optical-semiconductor element encapsulation with which the resin encapsulation of optical semiconductor elements in producing an optical semiconductor device can be easily conducted and which enables the optical semiconductor device obtained to retain a high efficiency of light takeout.

Another object of the invention is to provide a process for producing an optical semiconductor device using the sheet.

Other objects and effects of the invention will become apparent from the following description.

The invention relates to:

[1] A sheet for optical-semiconductor element encapsulation, which has a multilayer structure comprising two or more resin layers, the resin layers comprising:

(A) an outermost resin layer (layer A) that is to be brought into contact with one or more optical semiconductor elements; and (B) a resin layer (layer B) disposed on the layer A and having a lower refractive index than that of the layer A;

[2] The sheet as described in [1] above, further comprising one or more resin layers disposed on the layer B,
wherein the resin layers constituting the sheet have refractive indexes that are decreasing, layer by layer, from the layer A toward the resin layers away from the optical semiconductor elements;

[3] The sheet as described in [1] or [2] above, wherein the layer A has a refractive index of 1.6 or higher;

[4] The sheet as described in any one of [1] to [3] above, wherein the layer A comprises a polycarbodiimide;

[5] The sheet as described in [4] above, wherein the layer B comprises an epoxy resin; and

[6] A process for producing an optical semiconductor device, which comprises the steps of:

(1) superposing the sheet as described in any one of [1] to [5] above on an optical semiconductor element(s)-mounted side of a wiring circuit board so that the layer A is brought into contact with the optical semiconductor element(s); and (2) press-molding the sheet superposed in step (1).

The invention gives an effect that the resin encapsulation of optical semiconductor elements in producing an optical semiconductor device can be easily conducted.

Figure 1:
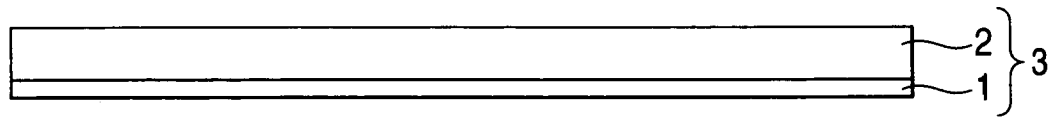
FIG. 1 illustrates one embodiment of the sheet for optical-semiconductor element encapsulation of the invention.

The reference numerals used in the drawings denote the followings, respectively:

1: Layer A,
2: Layer B,
3: Sheet for optical-semiconductor element encapsulation,
4: Wiring board,
5: Optical semiconductor element,
6: Laminator, and
7: Stamper.

DETAILED DESCRIPTION OF THE INVENTION

The sheet for optical-semiconductor element encapsulation of the invention has a multilayer structure comprising two or more resin layers, and one major feature thereof resides in that the resin layers comprise, on an outermost resin layer (layer A) that is disposed on the side to be in contact with one or more optical semiconductor elements, a resin layer (layer B) having a lower refractive index than that of the layer A.

An example of the sheet 3 for optical-semiconductor element encapsulation of the invention is shown in FIG. 1. This sheet 3 comprises a layer A 1 and a layer B 2 superposed thereon.

The optical semiconductor elements 5 to which the sheet of the invention is applied are not particularly limited as long as these are ones for ordinary use in optical semiconductor devices. Examples thereof include gallium nitride (GaN; refractive index, 2.5), gallium-phosphorus (GaP; refractive index, 2.9), and gallium-arsenic (GaAs; refractive index, 3.5). GaN is preferred of these because it emits a blue light and a white LED can be produced therefrom using a phosphor therewith.

The wiring circuit board 4 on which optical semiconductor elements are to be mounted also is not particularly limited. Examples thereof include rigid wiring boards produced by superposing a copper wiring on a glass-epoxy substrate and flexible wiring boards produced by superposing a copper wiring on a polyimide film.

Examples of methods for mounting optical semiconductor elements 5 on the wiring circuit board 4 include: a face-up bonding method, which is suitable for mounting optical semiconductor elements each having an electrode disposed on the light emission-side face thereof; and a flip chip bonding method, which is suitable for mounting optical semiconductor elements each having an electrode disposed on the face thereof opposite to the light emission-side face.

Examples of the resin to be used for forming the layer A 1 include polyethersulfones, polyimides, aromatic polyamides, polycarbodiimides, epoxy resins, and triacetylcellulose. By thermally curing such a resin in the manner which will be described later, optical semiconductor elements are encapsulated. The refractive index of the layer A, i.e., the refractive index of the cured resin, is preferably 1.6 or higher, more preferably 1.6 to 2.1, particularly preferably 1.7 to 2.1, from the standpoint of heightening the efficiency of light takeout from the optical semiconductor elements. This refractive index can be measured by the method described in Production Examples, which will be given later. The refractive index of the layer A can be adjusted to a desired value by appropriately selecting the kind of the resin constituting the layer A, components of the resin, component proportions, etc.

Polycarbodiimides are preferred as the resins usable for constituting the layer A because a high refractive index is obtained therewith. More preferred is a polycarbodiimide of the following general formula (1):

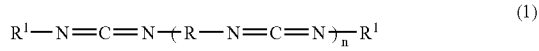
(1)

wherein R represents a diisocyanate residue, $R^1$ represents a monoisocyanate residue, and n is an integer of 1 to 100.

Those resins to be used may be commercial ones. As for polycarbodiimides, they may be produced, in the manner which will be described later, by subjecting one or more diisocyanates to a condensation reaction and blocking the terminals of the polymer with a monoisocyanate. In formula (1), R represents a residue of the diisocyanate used as a starting material and $R^1$ represents a residue of the monoisocyanate used as another starting material.

The diisocyanate and monoisocyanate to be used as starting materials may be either aromatic or aliphatic. The diisocyanate and the monoisocyanate each may consist of one or more aromatic isocyanates or one or more aliphatic isocyanates, or may comprise a combination of an aromatic isocyanate and an aliphatic isocyanate. From the standpoint of obtaining a high refractive index, it is preferred to use aromatic isocyanates. Namely, it is preferred that at least either of the diisocyanate and the monoisocyanate comprises an aromatic isocyanate or consists of one or more aromatic isocyanates, or that each of the diisocyanate and the monoisocyanate consists of one or more aromatic isocyanates. More preferred is the case in which the diisocyanate comprises a combination of an aliphatic isocyanate and an aromatic isocyanate and the monoisocyanate consists of one or more aromatic isocyanates. Especially preferred is the case in which the diisocyanate and the monoisocyanate each consist of one or more aromatic isocyanates.

Examples of diisocyanates usable in the invention include hexamethylene diisocyanate, dodecamethylene diisocyanate, 2,2,4-trimethylhexamethylene diisocyanate, 4,4'-dichlorohexylmethane diisocyanate, xylylene diisocyanate, tetramethylxylylene diisocyanate, isophorone diisocyanate, cyclohexyl diisocyanate, lysine diisocyanate, methylcyclohexane 2,4'-diisocyanate, 4,4'-diphenylmethane diisocyanate, 4,4'-diphenyl ether diisocyanate, 2,6-tolylene diisocyanate, 2,4-tolylene diisocyanate, naphthalene diisocyanate, 1-methoxyphenyl 2,4-diisocyanate, 3,3'-dimethoxy-4,4'-diphenylmethane diisocyanate, 4,4'-diphenyl ether diisocyanate, 3,3'-dimethyl-4,4'-diphenyl ether diisocyanate, 2,2-bis[4-(4-isocyanatophenoxy)phenyl]-hexafluoropropane, and 2,2-bis[4-(4-isocyanatophenoxy)-phenyl]propane.

From the standpoints of obtaining a high refractive index, it is preferred to use, among those diisocyanates, at least one member selected from the group consisting of tolylene diisocyanate, 4,4'-diphenylmethane diisocyanate, and naphthalene diisocyanate. More preferred is naphthalene diisocyanate.

Those diisocyanates can be used singly or as a mixture of two or more thereof.

The one or more diisocyanates to be used as a starting material preferably comprise one or more aromatic diisocyanates in an amount of preferably 10% by mole or larger (upper limit, 100% by mole) based on all diisocyanates. These diisocyanates desirably are ones enumerated above as preferred examples.

Examples of monoisocyanates usable in the invention include cyclohexyl isocyanate, phenyl isocyanate, p-nitrophenyl isocyanate, p- and m-tolyl isocyanates, p-formylphenyl isocyanate, p-isopropylphenyl isocyanate, and 1-naphthyl isocyanate.

Preferred monoisocyanates are aromatic monoisocyanates because aromatic monoisocyanates do not react with each other and the terminal blocking of a polycarbodiimide with such monoisocyanates proceeds efficiently. It is more preferred to use 1-naphthyl isocyanate.

Those monoisocyanates can be used singly or as a mixture of two or more thereof.

The amount of the monoisocyanate to be used for terminal blocking is preferably in the range of 1 to 10 mol per 100 mol of the diisocyanate ingredient to be used. When a monoisocyanate ingredient is used in an amount of 1 mol or larger per 100 mol of the diisocyanate ingredient, the polycarbodiimide obtained neither has too high a molecular weight nor undergoes a crosslinking reaction. Because of this, the polycarbodiimide solution, for example, undergoes neither an increase in viscosity nor solidification nor deterioration in storage stability. Such monoisocyanate ingredient amounts are hence preferred. On the other hand, when a monoisocyanate ingredient is used in an amount of 10 mol or smaller per 100 mol of the diisocyanate ingredient, the resultant polycarbodiimide solution has an appropriate viscosity. Because of this, film formation from the solution can be satisfactorily conducted, for example, through application and drying. Such monoisocyanate ingredient amounts are hence preferred. The polycarbodiimide solution obtained through terminal blocking with a monoisocyanate used in an amount within the above-described range, in terms of the amount thereof relative to the diisocyanate ingredient amount, is excellent especially in storage stability.

The polycarbodiimide for use in the invention can be produced by converting one or more diisocyanates as a starting material to a carbodiimide through condensation reaction in a predetermined solvent in the presence of a catalyst for carbodiimide formation and blocking the terminals of the resultant carbodiimide polymer with a monoisocyanate.

The diisocyanate condensation reaction is conducted at a temperature of generally 0 to 150° C., preferably 10 to 120° C.

In the case where an aliphatic diisocyanate and an aromatic diisocyanate are used in combination as starting-material diisocyanates, it is preferred to react the diisocyanates at a low temperature. The reaction temperature is preferably 0 to 50° C., more preferably 10 to 40° C. Use of a reaction temperature in this range is preferred because the condensation of the aliphatic diisocyanate with the aromatic diisocyanate proceeds sufficiently.

In the case where an excess aromatic diisocyanate present in the reaction mixture is desired to be further reacted with the polycarbodiimide formed from an aliphatic diisocyanate and an aromatic diisocyanate, the reaction temperature is preferably 40 to 150° C., more preferably 50 to 120° C. As long as the reaction temperature is within this range, any desired solvent can be used to smoothly conduct the reaction. The reaction temperature range is therefore preferred.

The diisocyanate concentration in the reaction mixture is preferably from 5 to 80% by weight. As long as the diisocyanate concentration is within this range, carbodiimide formation proceeds sufficiently and reaction control is easy. The diisocyanate concentration range is therefore preferred.

Terminal blocking with a monoisocyanate can be accomplished by adding the monoisocyanate to the reaction mixture in an initial, middle, or final stage of carbodiimide formation from the diisocyanate(s) or throughout the carbodiimide formation. The monoisocyanate is preferably an aromatic monoisocyanate.

As the catalyst for carbodiimide formation, any of known phosphorus compound catalysts can be advantageously used. Examples thereof include phospholene oxides such as 1-phenyl-2-phospholene 1-oxide, 3-methyl-2-phospholene 1-oxide, 1-ethyl-2-phospholene 1-oxide, 3-methyl-1-phenyl-2-phospholene 2-oxide, and the 3-phospholene isomers of these.

The solvent (organic solvent) to be used for producing the polycarbodiimide is a known one. Examples thereof include halogenated hydrocarbons such as tetrachloroethylene, 1,2-dichloroethane and chloroform, ketone solvents such as acetone, methyl ethyl ketone, methyl isobutyl ketone and cyclohexanone, cyclic ether solvents such as tetrahydrofuran and dioxane, and aromatic hydrocarbon solvents such as toluene and xylene. These solvents can be used singly or as a mixture of two or more thereof. These solvents may be used also for dissolving the obtained polycarbodiimide.

The end point of the reaction can be ascertained by infrared spectroscopy (IR analysis) from the occurrence of absorption attributable to the carbodiimide structure (N=C=N) (2,140 cm$^{-1}$) and the disappearance of absorption attributable to the isocyanates (2,280 cm$^{-1}$).

After completion of the carbodiimide-forming reaction, a polycarbodiimide is obtained usually in the form of a solution. However, the solution obtained may be poured into a poor solvent such as methanol, ethanol, isopropyl alcohol, or hexane to precipitate the polycarbodiimide and remove the unreacted monomers and the catalyst.

In preparing a solution of the polycarbodiimide which has been recovered as a precipitate, the precipitate is washed and dried in a predetermined manner and then dissolved again in an organic solvent. By performing this operation, the polycarbodiimide solution can have improved storage stability.

In the case where the polycarbodiimide solution contains by-products, the solution may be purified, for example, by adsorptively removing the by-products with an appropriate adsorbent. Examples of the adsorbent include alumina gel, silica gel, activated carbon, zeolites, activated magnesium oxide, activated bauxite, Fuller's earth, activated clay, and molecular sieve carbon. These adsorbents can be used singly or in combination of two or more thereof.

By the method described above, the target polycarbodiimide is obtained. This polycarbodiimide is preferably one in which the backbone structure is constituted of aromatic and aliphatic diisocyanates and the terminals have been blocked with an aromatic monoisocyanate. More preferred is one in which the backbone structure is constituted of one or more aromatic diisocyanates and the terminals have been blocked with an aromatic monoisocyanate.

Specifically, the polycarbodiimide is preferably one in which 10% by mole or more (upper limit, 100% by mole) of the diisocyanate residues represented by R in formula (1) are residues of one or more aromatic diisocyanates and the monoisocyanate residues represented by $R^1$ in formula (1) are residues of one or more aromatic monoisocyanates. The aromatic diisocyanate residues are preferably residues of at least one member selected from the group consisting of tolylene diisocyanate, 4,4'-diphenylmethane diisocyanate, and naphthalene diisocyanate, and more preferably are naphthalene diisocyanate residues. The aromatic monoisocyanate residues are preferably 1-naphthyl isocyanate residues.

The refractive index of the layer A comprising the polycarbodiimide obtained above is preferably 1.6 to 2.1.

Fine inorganic particles such as titanium oxide or zirconium oxide may be dispersed in a resin layer to form the layer A for the purpose of adjusting the refractive index of the layer A.

The resin layer constituting the layer A is obtained, for example, in the following manner. The resin is dissolved in an organic solvent, such as toluene, cyclohexanone or methyl ethyl ketone, so as to result in a concentration of preferably 20 to 50% by weight to prepare a resin solution. This solution is formed into a film having an appropriate thickness, for example, on a release sheet having a silicone-treated surface or on the layer B by a technique such as casting, spin coating or roll coating. This film is dried at such a temperature that the solvent can be removed without causing a curing reaction to proceed, whereby the resin layer is obtained. The temperature at which the resin solution which has been formed into a film is dried cannot be unconditionally determined because it varies depending on the kinds of the resin and solvent. However, the temperature is preferably 20 to 350° C., more preferably 50 to 200° C., particularly preferably 70 to 200° C. The thickness of the resin layer obtained through drying with heating is preferably 2 to 50 μm, more preferably 5 to 30 μm, when followability to optical semiconductor elements is taken into account. The resin layer thus obtained may be used as the layer A, or a laminate of two or more such resin layers may be used as the layer A.

Examples of the resin to be used for forming the layer B 2 include the same resins as those enumerated above with regard to the layer A. By thermally curing such a resin in the manner which will be described later, optical semiconductor elements are encapsulated. The refractive index of the layer B, i.e., the refractive index of the cured resin, is not particularly limited as long as it is lower than the refractive index of the layer A. However, from the standpoint of heightening the efficiency of light takeout from the optical semiconductor elements, the refractive index of the layer B is preferably 1.1 to less than 1.6, more preferably 1.3 to less than 1.6. This refractive index can be measured by the method described in Production Examples, which will be given later. The refractive index of the layer B can be adjusted to a desired value by suitably selecting the kind of the resin constituting the layer B, components of the resin, component proportions, etc.

Of the resins usable as the layer B, epoxy resins are preferred from the standpoints of ease of molding and low cost. Fine inorganic particles such as titanium oxide or zirconium oxide may be dispersed in the resin layer for the purpose of adjusting the refractive index of the layer B. Furthermore, a transparent rubber/elastomer which does not inhibit visible-light transmission may be incorporated for the purpose of improving the flexibility of the layer B.

The resin layer constituting the layer B is obtained, for example, in the following manner. A commercial product of the resin is dissolved in an organic solvent, such as toluene, cyclohexanone or methyl ethyl ketone, so as to result in a concentration of preferably 20 to 50% by weight to prepare a resin solution. This solution is formed into a film having an appropriate thickness, for example, on a release sheet having a silicone-treated surface or on the layer A by a technique such as casting, spin coating or roll coating. This film is dried at such a temperature that the solvent can be removed without causing a curing reaction to proceed, whereby the resin layer is obtained. The temperature at which the resin solution which has been formed into a film is dried cannot be unconditionally determined because it varies depending on the kinds of the resin and solvent. However, the temperature is preferably 20 to 180° C., more preferably 50 to 150° C., particularly preferably 70 to 120° C. The thickness of the resin layer obtained through drying with heating is preferably 10 to 500 µm, more preferably 15 to 250 µm, when followability to optical semiconductor elements is taken into account. The resin layer thus obtained may be used as the layer B, or a laminate of two or more such resin layers may be used as the layer B.

The sheet for optical-semiconductor element encapsulation of the invention may be produced, for example, by separately producing a layer A and a layer B and then laminating these layers to each other by a known technique (e.g., laminating with heating/pressing, vacuum laminating, or vacuum pressing). Alternatively, the sheet may be produced by directly forming a layer B on a layer A produced beforehand, or by directly forming a layer A on a layer B produced beforehand. Furthermore, the sheet may optionally have one or more resin layers superposed on the layer B. In this case, examples of the resins to be used as these resin layers include the same resins as those enumerated above with regard to the layer A. It is preferred that these resin layers should have been disposed such that their refractive indexes become sequentially smaller, layer by layer, from the layer A toward the resin layers away from the optical semiconductor elements. When the efficiency of light takeout and the trouble of layer superposition are taken into account, the sheet for optical-semiconductor element encapsulation of the invention preferably has two to five resin layers, and more preferably has two resin layers. The thickness of the sheet thus obtained is preferably about 150 to 300 µm when the height of the optical semiconductor elements and molding with a stamper are taken into account.

A preferred combination of the layer A and layer B in the invention, from the standpoints of the efficiency of light takeout and ease of molding, is one in which the layer A is a polycarbodiimide and the layer B is an epoxy resin.

The process for producing an optical semiconductor device using the optical-semiconductor element encapsulation sheet of the invention obtained above will be explained below.

One major feature of the process of the invention for producing an optical semiconductor device resides in that the process comprises:

(1) superposing the sheet for optical-semiconductor element encapsulation obtained above on an optical semiconductor element(s)-mounted side of a wiring circuit board; and (2) press-molding the sheet superposed in step (1).

Figure 2:
FIG. 2 illustrates one embodiment of step (1) of the process of the invention in which a sheet for optical-semiconductor element encapsulation is superposed over optical semiconductor elements.

Examples of methods for the step in which the sheet for optical-semiconductor element encapsulation of the invention is superposed on a wiring circuit board on its side where one or more optical semiconductor elements have been mounted include a method in which the sheet 3 of the invention (sheet comprising a layer A 1 and a layer B 2 superposed thereon) is laminated by means of, e.g., a laminator 6 onto a wiring circuit board 4 having optical semiconductor elements 5 mounted thereon, as shown in FIG. 2.

In the case where the sheet of the invention is melted and laminated onto a wiring circuit board by thermal press bonding with a laminator 6 or the like as shown in FIG. 2, it is preferred that the sheet be heated to preferably 70 to 250° C., more preferably 100 to 200° C., and pressed at preferably 0.1 to 10 MPa, more preferably 0.5 to 5 MPa. When a laminator is used, the revolution speed thereof is preferably 100 to 2,000 rpm, more preferably 500 to 1,000 rpm.

Step (1) as illustrated above is followed by step (2). Step (2) of the invention also has a significant feature. Since the resin layers differing in refractive index can be press-molded at a time, an optical semiconductor device can be easily produced without impairing the efficiency of light takeout of the optical semiconductor device.

The press molding of the sheet can be conducted with a stamper or the like. In the invention, the stamper to be used can be, for example, one obtained by forming a polyimide sheet or polycarbonate sheet into a predetermined die by laser processing, or one produced by plating such a die as a master with a metal, e.g., nickel.

Figure 3:
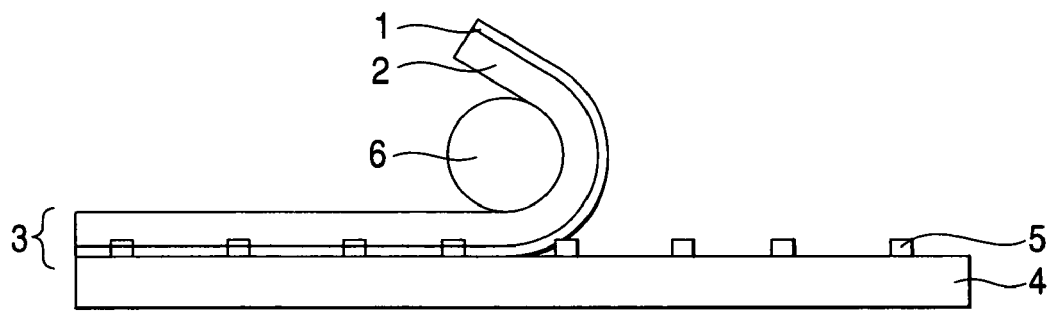
FIG. 3 illustrates one embodiment of step (2) of the process of the invention in which the sheet for optical-semiconductor element encapsulation is press-molded with a stamper.
Figure 4:
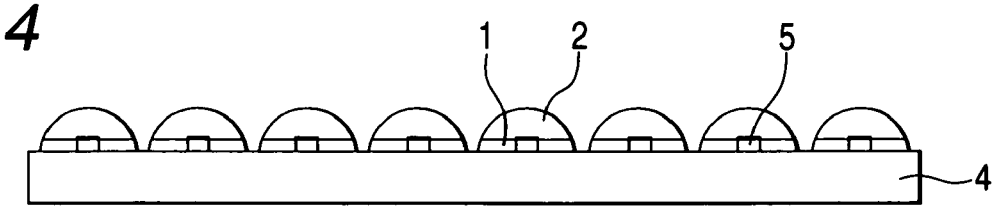
FIG. 4 illustrates one embodiment of optical semiconductor devices produced by the process of the invention.

The press molding of the sheet with a stamper can be conducted, for example, in the manner shown in FIG. 3. The stamper 7 is aligned so that a resin layer having recesses or protrusions can be formed over the optical semiconductor elements 5. This assemblage is inserted into a space between a heated pressing plate and another heated pressing plate and heated/pressed, whereby the sheet formed in step (1) can be thermally cured and molded as shown in FIG. 4.

Examples of the conditions for the heating/pressing include a temperature for the heating of preferably 70 to 250° C., more preferably 100 to 200° C., a pressure for the pressing of preferably 0.1 to 10 MPa, more preferably 0.5 to 5 MPa, and a period of this heating/pressing of preferably from 5 seconds to 3 minutes, more preferably from 10 seconds to 1 minute.

By molding the sheet on the optical semiconductor elements into a shape having recesses or protrusions, light regulation and an improvement in the efficiency of light takeout can be attained due to the resultant lenses.

By the process of the invention, in which the sheet having two or more resin layers differing in refractive index is superposed on a wiring circuit board and the resin layers over the optical semiconductor elements are press-molded with a stamper or the like, the resin encapsulation of the optical semiconductor elements can be easily conducted without impairing the efficiency of light takeout.

EXAMPLES

The present invention will be illustrated in greater detail with reference to the following Examples, but the invention should not be construed as being limited thereto.

In the following Example and Comparative Examples, all the synthesis reactions were conducted in a nitrogen stream. IR analysis was made with FT/IR-230 (manufactured by Nippon Bunko K.K.).

Production Example 1

Production of Polycarbodiimide Sheet

Into a 500-mL four-necked flask equipped with a stirrer, dropping funnel, reflux condenser, and thermometer were introduced 29.89 g (171.6 mmol) of tolylene diisocyanate (isomer mixture; T-80, manufactured by Mitsui-Takeda Chemical), 94.48 g (377.52 mmol) of 4,4'-diphenylmethane diisocyanate, 64.92 g (308.88 mmol) of naphthalene diisocyanate, and 184.59 g of toluene. These ingredients were mixed together.

Thereto were added 8.71 g (51.48 mmol) of 1-naphthyl isocyanate and 0.82 g (4.29 mmol) of 3-methyl-1-phenyl-2-phospholene 2-oxide. The resultant mixture was heated to 100° C. with stirring and held for 2 hours.

The progress of reactions was ascertained by IR analysis. Specifically, the decrease in the amount of absorption by N=C=O stretching vibration attributable to the isocyanates (2,280 $cm^{-1}$) and the increase in the amount of absorption by N=C=N stretching vibration attributable to carbodiimide (2,140 $cm^{-1}$) were followed. After the end point of the reactions was ascertained by IR analysis, the reaction mixture was cooled to room temperature. Thus, a polycarbodiimide solution was obtained (This solution is used in Comparative Example 2). In this polycarbodiimide, 100% by mole of the diisocyanate residues were aromatic diisocyanate residues. This polycarbodiimide was represented by general formula (1) described above wherein n had a distribution of from 15 to 77.

Subsequently, the polycarbodiimide solution was applied onto a separator (thickness, 50 μm) (manufactured by Mitsubishi Polyester Film Corporation) consisting of a poly(ethylene terephthalate) film treated with a release agent (fluorinated silicone). This coating was heated at 130° C. for 1 minute and then at 150° C. for 1 minute. Thereafter, the separator was removed to obtain a temporarily cured sheet-form polycarbodiimide (thickness, 20 μm).

The sheet-form polycarbodiimide thus obtained was cured in a 150° C. curing oven. This cured resin was examined for refractive index with a multi-wavelength Abbe's refractometer (DR-M4, manufactured by ATAGO Co., Ltd.) at a wavelength of 589 nm and a temperature of 25° C. The refractive index of the cured resin was found to be 1.758.

Production Example 2

Production of Epoxy Resin Sheet

Tablets of an epoxy resin (NT-300S, manufactured by Nitto Denko Corp.) were pulverized into a powder with a mortar. Subsequently, 200 g of the epoxy resin powder was gradually added to 200 g of methyl ethyl ketone (MEK) with stirring and completely dissolved therein to prepare a resin solution having a solid concentration of 50 wt %. The resin solution thus obtained was applied to a separator (thickness, 50 μm) (manufactured by Mitsubishi Polyester Corp.) consisting of a poly(ethylene terephthalate) film treated with a release agent (fluorinated silicone). This coating was heated at 100° C. for 2 minutes and then at 120° C. for 2 minutes. Thereafter, the separator was removed to obtain a temporarily cured sheet-form epoxy resin (thickness, 50 μm).

The sheet-form epoxy resin thus obtained was cured in a 120° C. curing oven. This cured resin was examined for refractive index with a multi-wavelength Abbe's refractometer (DR-M4, manufactured by ATAGO Co., Ltd.) at a wavelength of 589 nm and a temperature of 25° C. The refractive index of the cured resin was found to be 1.520.

Example 1

Three sheets of the temporarily cured sheet-form epoxy resin obtained in Production Example 2 were laminated together at 100° C. with a heat laminator (NLE-550ST, manufactured by Nitto Seiki Inc.) to produce a layer B having a thickness of 150 μm. The temporarily cured sheet-form polycarbodiimide obtained in Production Example 1 was laminated as a layer A onto the layer B at 100° C. with a heat laminator (NLE-550ST, manufactured by Nitto Seiki Inc.). Thus, an optical-semiconductor element encapsulation sheet of the invention having a thickness of 170 μm was produced.

This sheet was laminated onto a wiring circuit board having optical GaN semiconductor elements mounted thereon. This lamination was conducted with a vacuum laminator (V-130, manufactured by Nichigo-Morton Co., Ltd.) in such a manner that the layer A came into contact with the optical semiconductor elements.

Subsequently, a stamper (made of polyimide) having 0.74-mm-diameter recesses with a depth of 0.17 mm was used to press-mold the sheet at 1.5 MPa for 30 seconds in an atmosphere of 170° C. and 0.1 MPa. Thus, an optical semiconductor device was produced.

Comparative Example 1

An optical semiconductor device was produced in the same manner as in Example 1, except that four sheets of the temporarily cured sheet-form epoxy resin produced in Production Example 2 were used as the only material to produce an optical-semiconductor element encapsulation sheet.

Comparative Example 2

The polycarbodiimide solution obtained in Production Example 1 was applied with a spin coater onto a wiring circuit board having optical semiconductor elements mounted thereon to thereby form a layer A. Subsequently, dies for encapsulation were disposed on the circuit board, and a liquid epoxy resin was poured into the dies. These dies were covered and the epoxy resin was cured at 120° C. for 12 hours. Thus, an optical semiconductor device was produced.

Test Example

A voltage was applied to the optical semiconductor devices produced in Example 1 and Comparative Examples 1 and 2 to measure the quantity of light emitted by each device. In this light quantity measurement, the quantity of overall light emitted was measured with MCPD-3000 (manufactured by Otsuka Electronics Co., Ltd.) using an integrating sphere. The results obtained are shown in Table 1.

TABLE 1

| | Quantity of light emitted (μW/cm²/nm) |
|---|---|
| Example 1 | 1.00 |
| Comparative Example 1 | 0.72 |
| Comparative Example 2 | 0.97 |

The results given above show the following. The optical semiconductor device of Example 1 emitted a larger quantity of light than the optical semiconductor device obtained in Comparative Example 1. It can hence be seen that the device of Example 1 had a high efficiency of light takeout. In contrast to Example 1, Comparative Example 2 had a drawback that the production steps were complicated because of the necessity of disposing encapsulation dies for individual optical semiconductor elements and pouring a resin thereinto.

The optical semiconductor device produced according to the invention is suitable for use as, e.g., a surface light source for personal computers, cell phones, etc.

While the present invention has been described in detail and with reference to specific embodiments thereof, it will be apparent to one skilled in the art that various changes and modifications can be made therein without departing from the spirit and scope thereof.

The present application is based on Japanese Patent Application No. 2004-111050 filed Apr. 5, 2004, the contents thereof being herein incorporated by reference.

What is claimed is:

1. A sheet for optical-semiconductor element encapsulation, which has a multilayer structure comprising at least two resin layers, the at least two resin layers comprising:
    (A) an outermost resin layer (layer A) that is to be brought into contact with one or more optical semiconductor elements; and
    (B) a resin layer (layer B) disposed on the layer A and having a lower refractive index than that of the layer A;
    wherein the layer A has a refractive index of 1.6 or higher.

2. The sheet of claim 1, further comprising one or more resin layers disposed on the layer B,
    wherein the resin layers constituting the sheet have refractive indexes that are decreasing, layer by layer, from the layer A toward the resin layers away from the optical semiconductor elements.

3. The sheet of claim 1, wherein the layer A comprises a polycarbodiimide.

4. The sheet of claim 3, wherein the layer B comprises an epoxy resin.

5. A process for producing an optical semiconductor device, which comprises the steps of:
    (1) superposing the sheet of claim 1 on an optical semiconductor element(s)-mounted side of a wiring circuit board so that the layer A is brought into contact with the optical semiconductor element(s); and
    (2) press-molding the sheet superposed in step (1).

* * * * *